(12) United States Patent  
Chen et al.

(10) Patent No.: US 9,178,008 B2  
(45) Date of Patent: Nov. 3, 2015

(54) METAL-INSULATOR-METAL CAPACITOR WITH CURRENT LEAKAGE PROTECTION

(75) Inventors: Kuo-Ji Chen, Wu-Ku (TW); Wen-Chuan Chiang, Hsin-Chu (TW); Huey-Chi Chu, Hsin-Chu (TW); Ming-Hsiang Song, Shin-Chu (TW); Chen-Jong Wang, Hsin-Chu (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 338 days.

(21) Appl. No.: 13/571,441

(22) Filed: Aug. 10, 2012

(65) Prior Publication Data

US 2014/0042590 A1    Feb. 13, 2014

(51) Int. Cl.  
*H01L 49/02* (2006.01)  
*H01L 29/92* (2006.01)

(52) U.S. Cl.  
CPC .............. *H01L 28/60* (2013.01); *H01L 29/92* (2013.01); *H01L 28/75* (2013.01)

(58) Field of Classification Search  
CPC .......... H01L 28/60; H01L 28/75; H01L 29/92  
USPC ............ 257/532, E21.009, E21.272, E23.167  
See application file for complete search history.

(56) References Cited

U.S. PATENT DOCUMENTS

| | | | |
|---|---|---|---|
| 2006/0022241 A1* | 2/2006 | Shimojo et al. | 257/296 |
| 2010/0065944 A1* | 3/2010 | Tu et al. | 257/532 |
| 2010/0155685 A1* | 6/2010 | Hurkx | 257/3 |
| 2010/0213572 A1* | 8/2010 | Ching et al. | 257/532 |
| 2010/0224960 A1* | 9/2010 | Fischer | 257/532 |

* cited by examiner

*Primary Examiner* — Selim Ahmed  
(74) *Attorney, Agent, or Firm* — Slater & Matsil, L.L.P.

(57) ABSTRACT

Methods and apparatus are disclosed for manufacturing metal-insulator-metal (MIM) capacitors. The MIM capacitors may comprise an electrode, which may be a top or bottom electrode, which has a bottle neck. The MIM capacitors may comprise an electrode, which may be a top or bottom electrode, in contact with a sidewall of a via. The sidewall contact or the bottle neck of the electrode may burn out to form a high impedance path when the leakage current exceeds a specification, while the sidewall contact or the bottle neck of the electrode has no impact for normal MIM operations. The MIM capacitors may be used as decoupling capacitors.

20 Claims, 7 Drawing Sheets

US 9,178,008 B2

METAL-INSULATOR-METAL CAPACITOR WITH CURRENT LEAKAGE PROTECTION

BACKGROUND

Complementary metal-oxide-semiconductor (CMOS) is a technology for constructing digital integrated circuits (IC) such as microprocessors, microcontrollers, and others, or analog circuits such as image sensors, data converters, and transceivers for many types of communication. An IC may comprise digital logic parts such as transistors, plus other components such as resistors and capacitors, connected together by metal layers.

Many kinds of capacitors such as metal-oxide-semiconductor (MOS) capacitors, PN junction capacitors, polysilicon-insulator-polysilicon (PIP) capacitors, and metal-insulator-metal (MIM) capacitors are used in semiconductor devices. In particular, the MIM capacitor offers reduced electrode resistance with wide ranges of applications.

An IC may comprise a plurality of contacts interconnected by multiple metal layers, which are separated by dielectric layers made of insulating materials forming inter-metal dielectric (IMD) layers. Interconnections between different metal layers are made by vias, which go through insulating dielectric layers. Vias allow for communications between devices such as capacitors formed at metal layers to communicate with other devices in the metal layers or directly with the semiconductor devices in the substrate.

Leakage current due to MIM capacitor defects can cause problems for the systems containing the MIM capacitors. To ensure a high product yield, it is desirable for an MIM capacitor to be able to self repair in the event of current leakage. There is a continuing need in the semiconductor device processing art for improved MIM capacitor structures and manufacturing processes to improve the yield in the event of current leakage.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the embodiments of the present disclosure are discussed in detail below. It should be appreciated, however, that the embodiments of the present disclosure provide many applicable concepts that can be embodied in a wide variety of specific contexts. The specific embodiments discussed are merely illustrative of specific ways to make and use the disclosure, and do not limit the scope of the disclosure.

Methods and apparatus are disclosed for manufacturing metal-insulator-metal (MIM) capacitors that are able to self repair in the event of current leakage. The MIM capacitors may comprise an electrode, which may be a top or a bottom electrode, which has a bottle neck. A top or a bottom electrode may be in contact with a sidewall of a via. The sidewall contact or the bottle neck of the electrode may burn out to form a high impedance path when the leakage current exceeds a specification, while the sidewall contact or the bottle neck of the electrode has no impact for normal MIM operations. The MIM capacitors may be used as decoupling capacitors.

Figure 1:
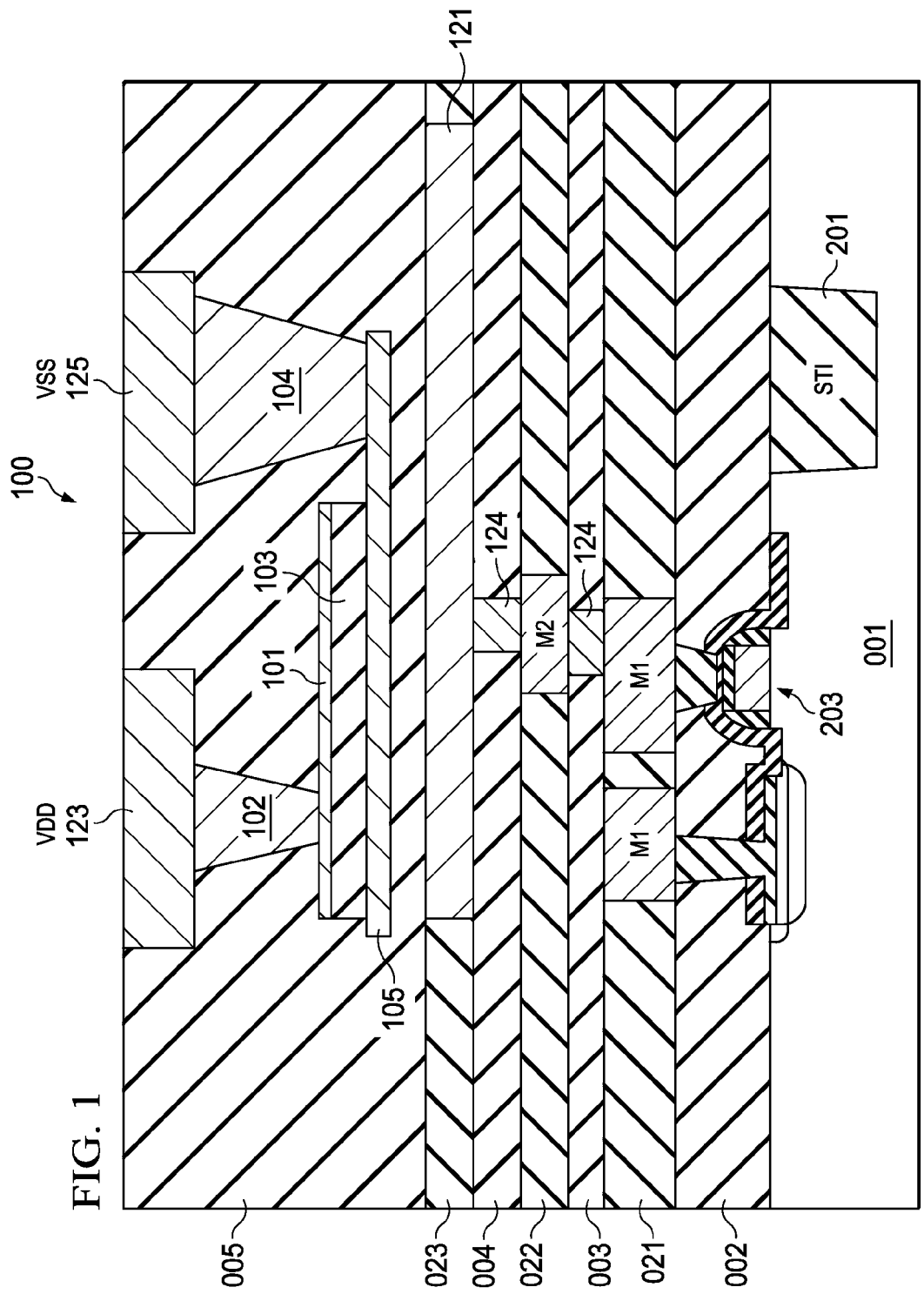
FIG. 1 illustrates an embodiment of a metal-insulator-metal (MIM) capacitor.

In FIG. 1, a MIM capacitor 100 may be formed within an inter-metal dielectric (IMD) layer 005 above a substrate 001. An inter-layer dielectric (ILD) layer 002, and a plurality of IMD layers 003 and 004, may be formed on the substrate 001 as well. A plurality of metal layers 021, 022, and 023 may be formed on the ILD layer 002, intervening with the IMD layers. There may be more metal layers formed above the MIM capacitor 100, which are not shown.

The substrate 001 may comprise active devices such as transistors 203, where a plurality of drain and source regions of transistors are formed within the substrate. Shallow trench isolation (STI) region 201 may be formed in substrate 001 as well. The substrate 001 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

Active devices such as transistors 203 may be formed on the substrate 001. As one of ordinary skill in the art will recognize, a wide variety of devices such as transistors, resistors, inductors and the like may be used to generate the desired structural and functional requirements of the design. The devices 203 may be formed using any suitable methods either within or else on the surface of the substrate 001.

An inter-layer dielectric (ILD) layer 002 may be formed on the substrate 001. A first metal layer 021 may be formed over the ILD layer 002, comprising a plurality of metal contacts M1 connected to the devices within the substrate by vias through the ILD layer 002. A second metal layer 022 may be formed on the first metal layer 021 separated by an inter-metal dielectric (IMD) layer 003, and a metal contact M2 is located in the metal layer 022. The IMD layers are commonly known in the art as being the dielectric layers for forming metal lines and vias therein. The IMD layers may have a thickness ranging from perhaps 10,000 Å to 30,000 Å. Similarly, an additional metal layer 023 may be formed on the metal layer 022 and separated by the IMD layer 004, where a metal contact 121 may be located. The metal contacts M1, M2, and 121 within various metal layers are connected by a plurality of vias 124.

The number of metal layers 021 to 023, the number of IMD layers, and the number of vias are only for illustrative purposes and are not limiting. There could be other number of layers that is more or less than the 3 metal layers. There may be other number of IMD layers, and other number of vias, different from those shown in FIG. 1.

The MIM capacitor 100 within the IMD layer 005 may comprise a bottom electrode 105, an insulator 103, and a top electrode 101. The top electrode 101 may be connected to a via 102, which is further connected to a top electrode pick up 123. The top electrode pick up 123 may be connected to a power source Vdd. The bottom electrode 105 may be connected to a via 104, which is further connected to a bottom electrode pick up 125. The bottom electrode pick up 125 may be connected to a ground signal Vss. The bottom electrode pick up 125 and the top electrode pick up 123 may be formed at a same metal layer, or at different metal layers.

The MIM capacitor 100 may be used as a decoupling capacitor. A decoupling capacitor (decap) is a popular means to reduce power supply noise in integrated circuits. When used as a decoupling capacitor, the MIM capacitor 100 may have one of the bottom electrode 105 or top electrode 101 connected to a power source VDD, and the other one connected to a ground signal VSS.

FIG. 1 is only for illustrative purposes and is not limiting. For example, there may be more than one MIM capacitor so formed. MIM capacitors may be formed in different shapes such as cylindrical shape, a concave shape, a stacked shape, and so forth. The MIM capacitor 100 shown in FIG. 1 may be a planar type MIM capacitor. There may be other types MIM capacitors, such as a crown type MIM capacitor. The circuit in FIG. 1 may comprise many other layers such as etching stop layers, which are not shown.

The MIM capacitor 100 shown in FIG. 1 may be formed by some known process or any process developed in the future. Each layer, such as the ILD layer, or the IMD layers may be deposited by methods including LPCVD, PECVD, or HDP-CVD. The patterning of the layers may be done using a damascene process or a dual damascene process. Damascene means formation of a patterned layer imbedded in another layer such that the top surfaces of the two layers are coplanar. An IMD is deposited either on a substrate, or on top of another existing layer of metal. Once the IMD is deposited, portions of the IMD may be etched away to form recessed features, such as trenches and vias, which can be filled with conductive material to connect different regions of the chip and accommodate the conductive lines. A damascene process which creates either only trenches or vias is known as a single damascene process. A damascene process which creates both trenches and vias at once is known as a dual damascene process.

Figure 2A:
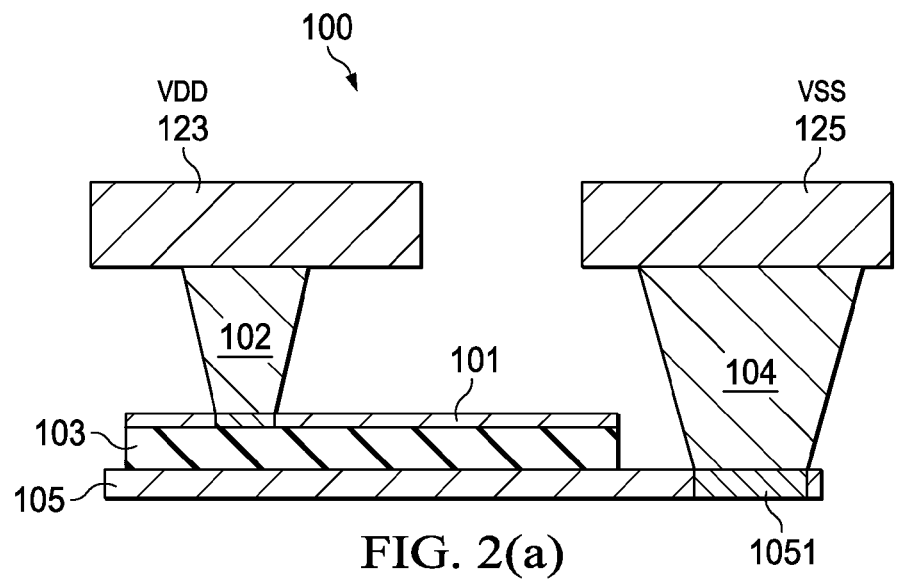
FIGS. 2(a)-2(c) illustrate another embodiment of a MIM capacitor.
Figure 2B:
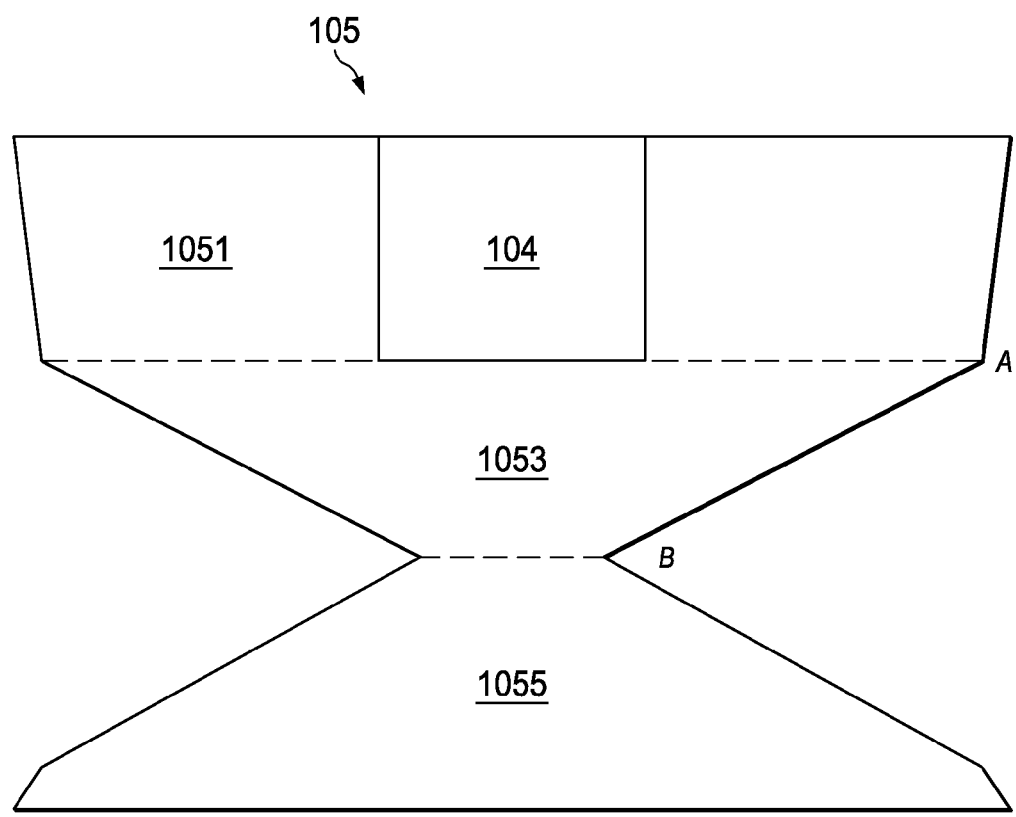
Figure 2C:
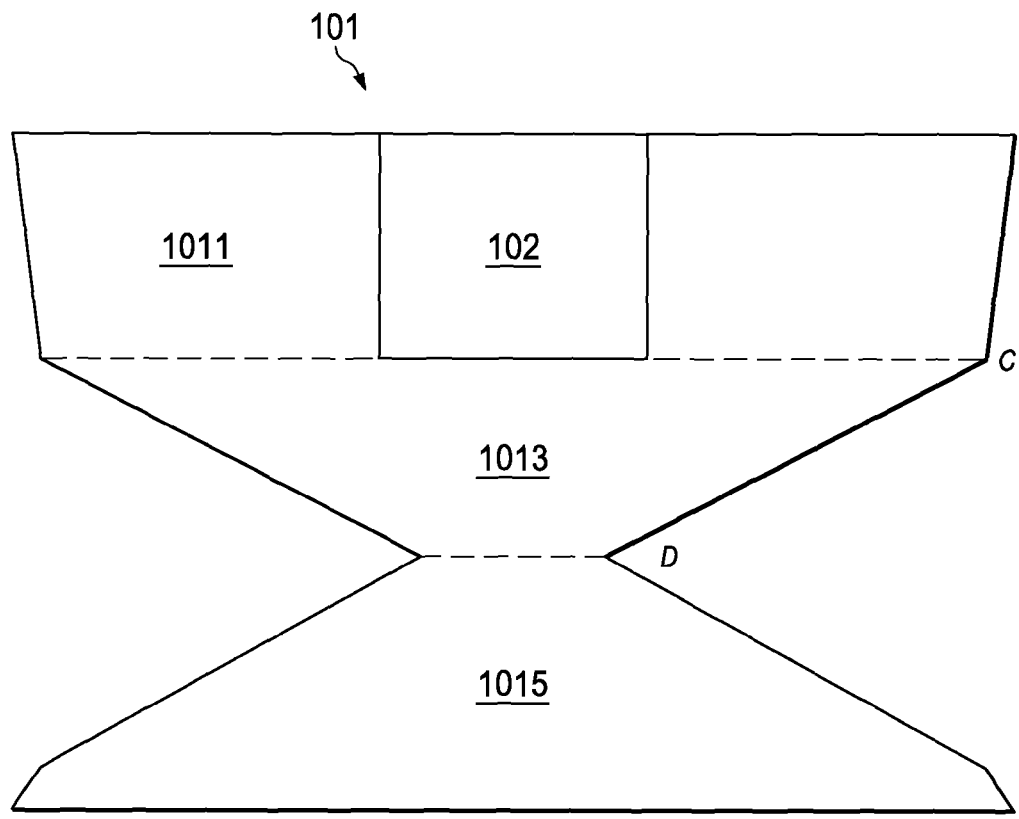

An embodiment of the MIM capacitor 100 is illustrated in FIGS. 2(a)-2(c). As shown in FIG. 2(a), the MIM capacitor 100 may comprise a bottom electrode 105, an insulator 103, and a top electrode 101. The top electrode 101 may be connected to a via 102, which is further connected to a top electrode pick up 123. The top electrode pick up 123 may be connected to a power source Vdd. The bottom electrode 105 may be connected to a via 104, which is further connected to a bottom electrode pick up 125. The bottom electrode pick up 125 may be connected to a ground signal Vss. The bottom electrode pick up 125 and the top electrode pick up 123 may be formed at a same metal layer, or at different metal layers.

Throughout the description, the bottom electrode 105 and the top electrode 101 may be formed of titanium nitride (TiN), tantalum nitride (TaN), tungsten (W), tungsten nitride (WN), ruthenium (Ru), iridium (Ir), and platinum (Pt), Copper (Cu), Cu alloy, or combinations of titanium (Ti) with titanium nitride. Generally, any other low-resistivity materials may be used as well.

An insulator 103 may be formed between the bottom electrode 105 and the top electrode 101. The insulator 103 may include silicon dioxide ($SiO_2$), silicon nitride ($Si_3N_4$), aluminum oxide ($Al_2O_3$), hafnium silicates (HfSiON), tantalum oxide ($Ta_2O_5$), zirconium oxide ($ZrO_2$), hafnium oxide ($HfO_2$), titanium oxide ($TiO_2$), barium strontium titanate oxide (BST), strontium titanate oxide (STO), and combinations thereof. The insulator 103 may comprise a plurality of sub-layers such as a first dielectric sub-layer and a second dielectric sub-layer, made of different material of different thickness.

As illustrated in FIG. 2(a), the via 104 may be placed on a surface of the bottom electrode 105, connecting to the bottom electrode pick up 125. The via 102 may be placed on a surface of a top electrode 101, connecting to the top electrode pick up 123.

As illustrated in FIG. 2(b), the bottom electrode 105 may comprise three parts 1051, 1053, and 1055, when viewed in plain view, i.e., "top down" view. The part 1051 is a part where the via 104 may be placed, which is also shown in FIG. 2(a). The part 1051 should be larger in area than the area of the bottom of the via 104 so that the bottom of the via 104 may be completely placed on the part 1051. The part 1051 may be a polygon, a rectangle, a square, a trapezoid, or any other shape.

The part of the bottom electrode 105 that is adjacent to the part 1051 may be numbered as the part 1053. The part 1053 may be a polygon, a trapezoid, or some other shape. An edge A of the part 1053 shared with the part 1051 may be longer than an edge B of the part 1053 shared with the part 1055. For example, if the part 1053 is a trapezoid, then the base edge A shared with the part 1051 is longer than the base edge B shared with the part 1055.

The part 1055 of the bottom electrode 105 shares an edge B with the part 1053. In an embodiment, the part 1055 may be a mirror image of the overall shape of the combined parts 1051 and 1053. In another embodiment, the part 1055 may be a trapezoid, where the base edge B shared with the part 1053 is shorter than the other base not shared.

The reduced length of the edge B of the part 1053 forms a bottle neck of the bottom electrode 105. If there is a current leakage, the contact at the bottle neck part, which is the edge B, may be burned out to form a high impedance path when the leakage current exceeds a specification. On the other hand, the MIM capacitor 100 may function normally when there is no current leakage.

Similar to FIG. 2(b), as illustrated in FIG. 2(c), the top electrode 101 may comprise three parts, 1011, 1013, and 1015. The part 1011 may be a part where the bottom of the via 102 may be placed. The part 1011 may be larger in area than the area of the bottom of the via 102 so that the bottom of the via 102 may be completely placed on the part 1011. The part 1011 may be a polygon, a rectangle, a square, a trapezoid, or any other shape.

The part 1013 of the top electrode 101 may be adjacent to the part 1011. The part 1013 may be a polygon, a trapezoid, or some other shape. An edge C of the part 1013 shared with the part 1011 may be longer than an edge D of the part 1013 shared with the part 1015. For example, if the part 1013 is a trapezoid, then the base edge C shared with the part 1011 is longer than the base edge D shared with the part 1015.

The part 1015 of the top electrode 101 shares an edge D with the part 1013. In an embodiment, the part 1015 may be a mirror image of the overall shape of the combined parts 1011 and 1013. In another embodiment, the part 1015 may be a trapezoid, where the base edge D shared with the part 1013 is shorter than the other base not shared.

The reduced length of the edge D of the part 1013 forms a bottle neck of the top electrode 101. If there is a current leakage, the contact at the bottle neck part, which is the edge D, may be burned out to form a high impedance path when the leakage current exceeds a specification. On the other hand, the MIM capacitor 100 may function normally when there is no current leakage or limited current leakage.

Figure 3A:
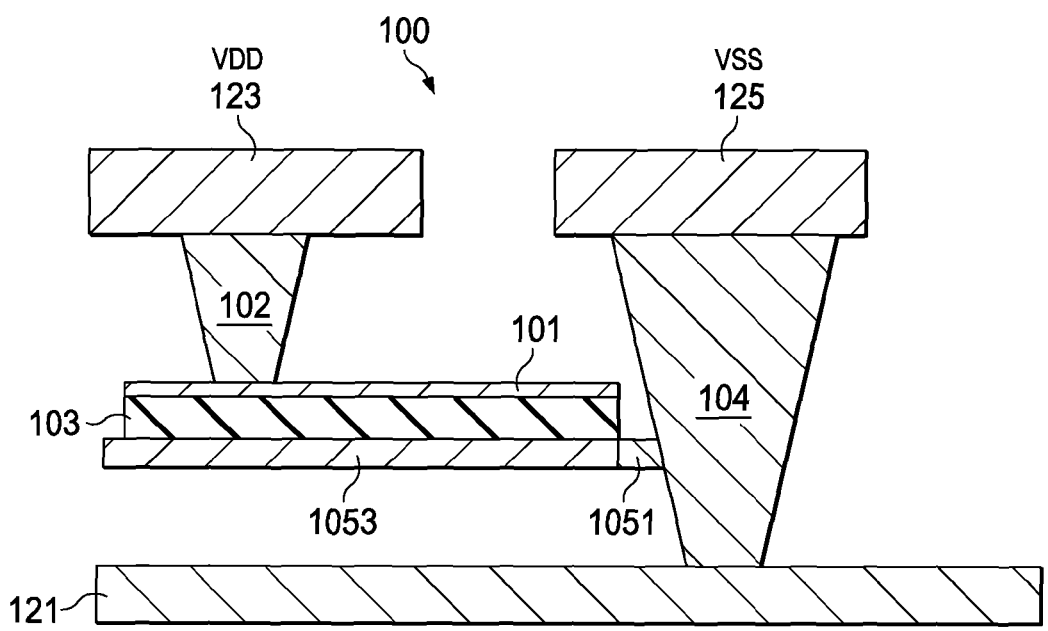
FIGS. 3(a)-3(c) illustrate another embodiment of a MIM capacitor.
Figure 3B:
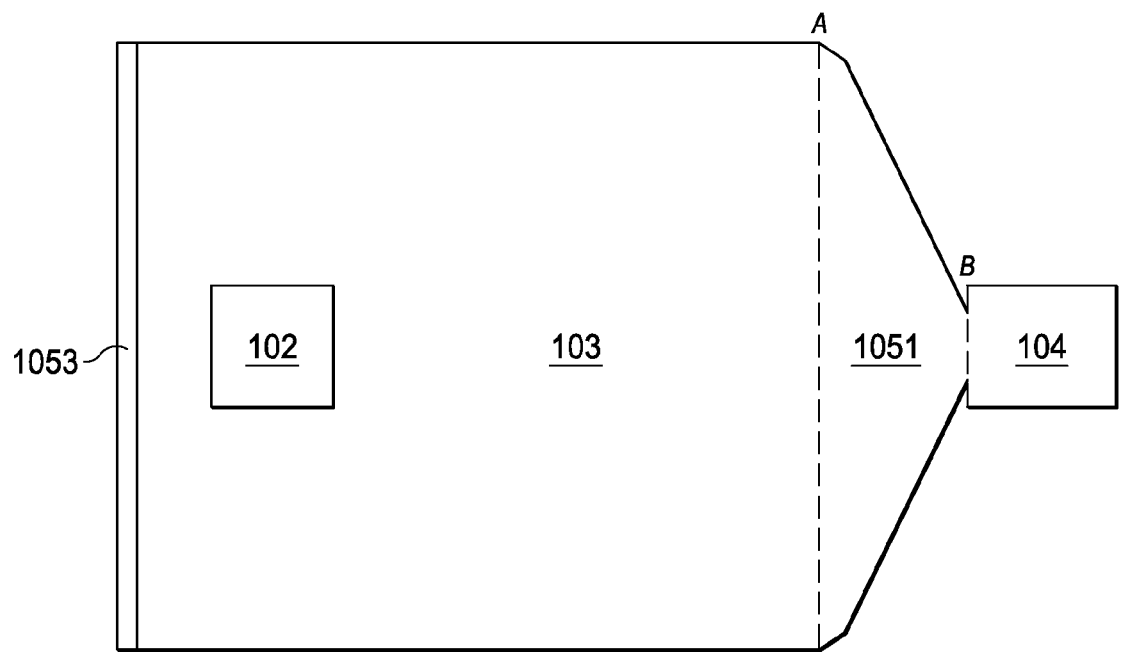
Figure 3C:
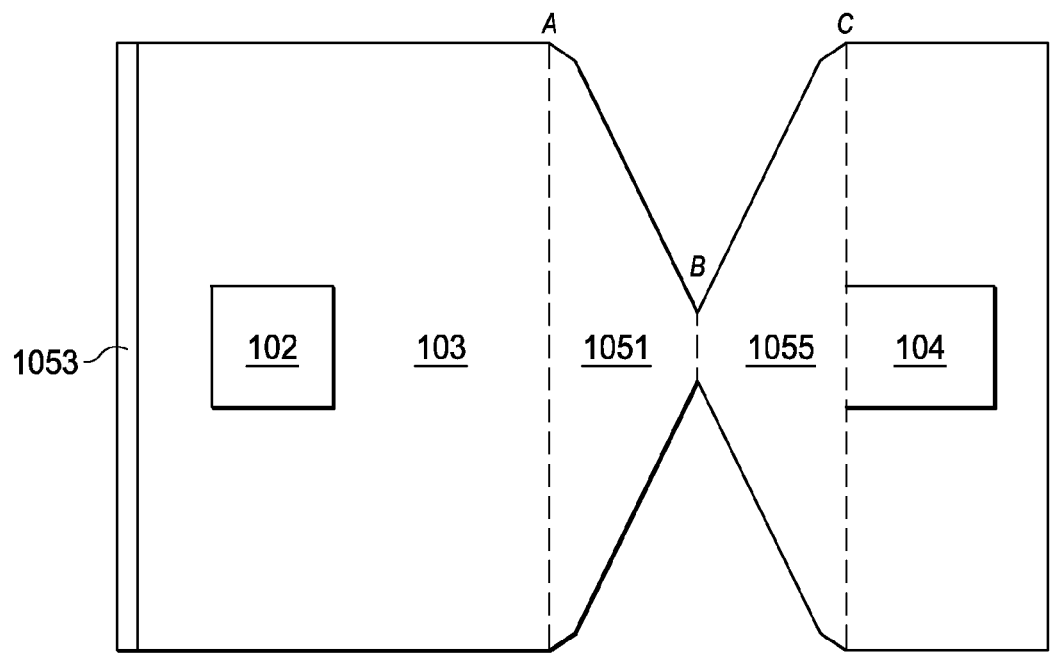

Another embodiment of the MIM capacitor 100 may be illustrated in FIGS. 3(a)-3(c). As shown in FIG. 3(a), the MIM capacitor 100 may comprise a bottom electrode 105, an insulator 103, and a top electrode 101. The top electrode 101 may be connected to a via 102, which is further connected to a top electrode pick up 123. The top electrode pick up 123 may be connected to a power source Vdd. The bottom electrode 105 may be connected to a via 104, which is further connected to a bottom electrode pick up 125. The bottom electrode pick up 125 may be connected to a ground signal Vss. The via 104 may be connected to a metal contact 121 at a different metal layer. The bottom electrode pick up 125 and the top electrode pick up 123 may be formed at a same metal layer, or at different metal layers.

As illustrated in FIG. 3(a), the via 102 may be placed on a surface of a top electrode 101, connecting to the top electrode pick up 123. The bottom electrode 105 may be connected to the via 104 by contacting with a sidewall of the via 104.

More details of the contact between a sidewall of the via 104 and the bottom electrode 105 are shown in FIG. 3(b) in top view. As illustrated in FIG. 3(b), the bottom electrode 105 may comprise two parts 1051 and 1053. The part 1053 may have a shape substantially similar to a shape of the top electrode 101, so that the two are overlapped in top view. The shape of the part 1053 may be substantially similar to a shape of the insulator 103 as well. The shape of the top electrode 101, which is substantially similar to the shape of the part 1053, may have a larger area than the bottom of the via 102, so that the via 102 may be placed on the surface of the top electrode 101. The part 1053 may be a polygon, a rectangle, a square, a trapezoid, or any other shape. A rectangle shape for the part 1053 is illustrated in FIG. 3(b).

The part 1051 of the bottom electrode 105 may be adjacent to the part 1053. The part 1051 may be a polygon, a trapezoid, or some other shape. An edge A of the part 1051 shared with the part 1053 may be longer than an edge B of the part 1051 shared with the sidewall of via 104. For example, if the part 1051 is a trapezoid, then the base edge A shared with the part 1053 is longer than the base edge B shared with the sidewall of via 104.

Another embodiment of the contact between a sidewall of the via 104 and the bottom electrode 105 are shown in FIG. 3(c) in top view. As illustrated in FIG. 3(c), the bottom electrode 105 may comprise three parts 1051, 1053, and 1055. The part 1053 may have a shape substantially similar to a shape of the top electrode 101, so that the two are overlapped in top view. The shape of the part 1053 may be substantially similar to a shape of the insulator 103 as well. The shape of the top electrode 101, which is substantially similar to the shape of the part 1053, may have a larger area than the bottom of the via 102, so that the via 102 may be placed on the surface of the top electrode 101. The part 1053 may be a polygon, a rectangle, a square, a trapezoid, or any other shape. A rectangle shape for the part 1053 is illustrated in FIG. 3(c).

The part of the bottom electrode 105 that is adjacent to the part 1053 may be numbered as the part 1051. The part of the bottom electrode 105 that is adjacent to the part 1051 and contacting with the side wall of the via 104 may be numbered as the part 1055.

The part 1051 may be a polygon, a trapezoid, or some other shape. An edge A of the part 1051 shared with the part 1053 may be longer than an edge B of the part 1051 shared with the part 1055. An edge C of the part 1055 is shared with the sidewall of via 104, which may be longer than the edge B as well. For example, if the part 1051 is a trapezoid, then the base edge A shared with the part 1053 is longer than the base edge B shared with the part 1055, while the part 1055 may be a mirror image of the part 1051, as shown in FIG. 3(c). In some other embodiment, the part 1055 may be a mirror image of the combined shape of the part 1051 and part 1053.

If there is a current leakage of the MIM capacitor 100, the contact between the bottom electrode 105 and a sidewall of the via 104 may be burned out to form a high impedance path when the leakage current exceeds a specification. On the other hand, the MIM capacitor 100 may function normally when there is no current leakage.

Figure 4A:
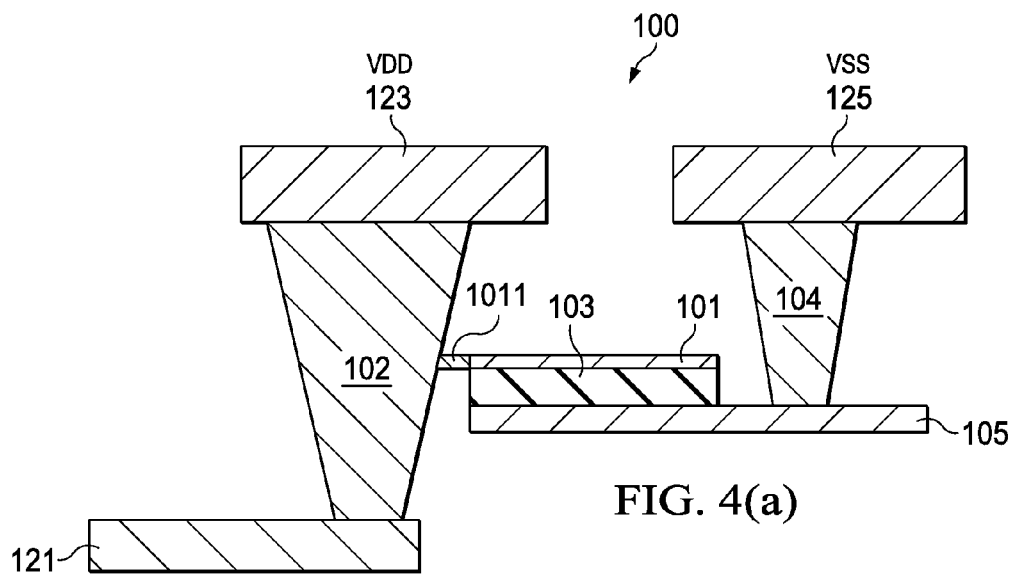
FIGS. 4(a)-4(b) illustrate another embodiment of a MIM capacitor.
Figure 4B:
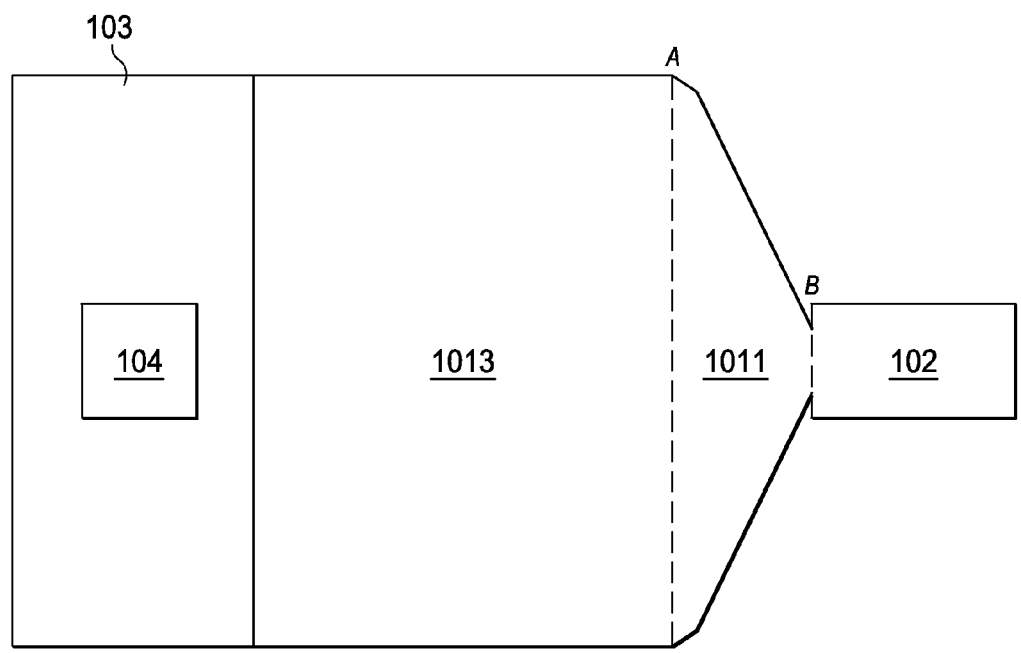

Another embodiment of the MIM capacitor 100 may be illustrated in FIGS. 4(a)-4(b). As shown in FIG. 4(a), the MIM capacitor 100 may comprise a bottom electrode 105, an insulator 103, and a top electrode 101. The top electrode 101 may be connected to a via 102, which is further connected to a top electrode pick up 123. The top electrode pick up 123 may be connected to a power source Vdd. The bottom electrode 105 may be connected to a via 104, which is further connected to a bottom electrode pick up 125. The bottom electrode pick up 125 may be connected to a ground signal Vss. The via 102 may be connected to a metal contact 121 at a different metal layer. The bottom electrode pick up 125 and the top electrode pick up 123 may be formed at a same metal layer, or at different metal layers.

As illustrated in FIG. 4(a), the via 104 may be placed on a surface of the bottom electrode 105, connecting to a bottom electrode pick up 125. The top electrode 101 is connected to the via 102 by contacting with a sidewall of the via 102.

More details of the contact between the via 102 and the top electrode 101 are shown in FIG. 4(b) in top view. As illustrated in FIG. 4(b), the top electrode 101 may comprise two parts 1011 and 1013. The part 1013 may have a shape substantially similar to a shape of the insulator 103, so that the two are overlapped. It may further be substantially similar to a shape of the bottom electrode 105. The shape of the bottom electrode 105, which may be substantially similar to the shape of the part 1013, may have a larger area than the bottom of the via 104, so that the via 104 may be placed on the surface of the bottom electrode 105. The part 1013 may be a polygon, a rectangle, a square, a trapezoid, or any other shape. A rectangle shape for the part 1013 is illustrated in FIG. 4(b).

The part 1011 of the top electrode 101 may be adjacent to the part 1013. The part 1011 may be a polygon, a trapezoid, or some other shape. An edge A of the part 1011 shared with the part 1013 may be longer than an edge B of the part 1011 shared with the sidewall of via 102. For example, if the part 1011 is a trapezoid, then the base edge A shared with the part 1013 is longer than the base edge B shared with the sidewall of via 102.

If there is a current leakage of the MIM capacitor 100, the contact between the top electrode 101 and a sidewall of the via 102 may be burned out to form a high impedance path when the leakage current exceeds a specification. On the other hand, the MIM capacitor 100 may function normally when there is no current leakage.

Figure 5A:
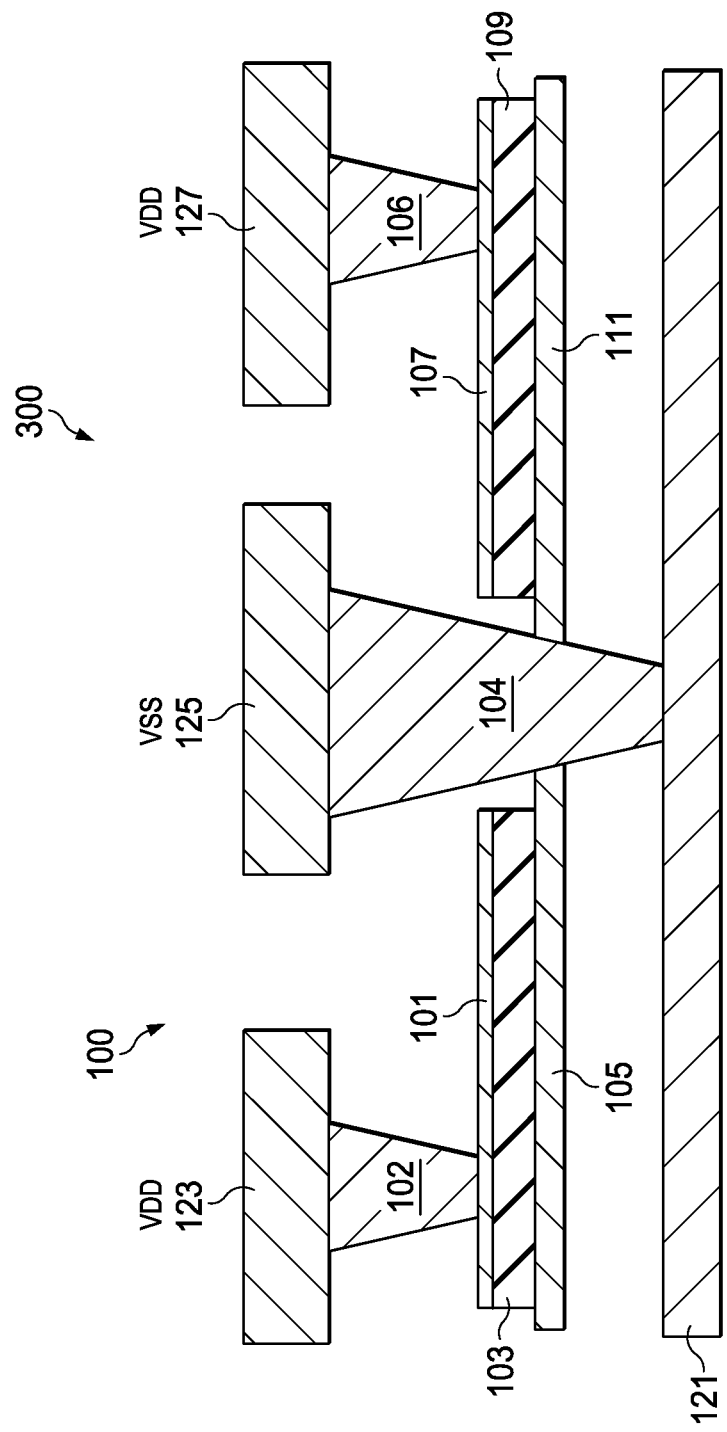
FIGS. 5(a)-5(b) illustrate an embodiment of two MIM capacitors.

Different MIM capacitors may be connected in a chain. An embodiment of two MIM capacitors 100 and 300 may be illustrated in FIGS. 5(a)-5(b). As shown in FIG. 5(a), the MIM capacitor 100 may comprise a bottom electrode 105, an insulator 103, and a top electrode 101. The top electrode 101 may be connected to a via 102, which is further connected to a top electrode pick up 123. The top electrode pick up 123 may be connected to a power source Vdd. The bottom electrode 105 may be connected to a via 104, which is further connected to a bottom electrode pick up 125. The bottom electrode pick up 125 may be connected to a ground signal Vss.

The MIM capacitor 300 may comprise a bottom electrode 111, an insulator 109, and a top electrode 107. The top electrode 107 may be connected to a via 106, which is further connected to a top electrode pick up 127. The top electrode pick up 127 may be connected to a power source Vdd. The bottom electrode 111 may be connected to the via 104, which is shared with the MIM capacitor 100. The via 104 is further connected to a bottom electrode pick up 125. The bottom electrode pick up 125 may be connected to a ground signal Vss. The bottom electrode pick up 125 and the top electrode pick up 127 may be formed at a same metal layer, or at different metal layers.

As illustrated in FIG. 5(a), the via 102 may be placed on a surface of a top electrode 101, connecting to a top electrode pick up 123. The bottom electrode 105 is connected to the via 104 by contacting with a sidewall of the via 104. The via 106 may be placed on a surface of a top electrode 107, connecting to a top electrode pick up 127. The bottom electrode 111 is connected to the via 104 by contacting with another sidewall of the via 104.

Figure 5B:
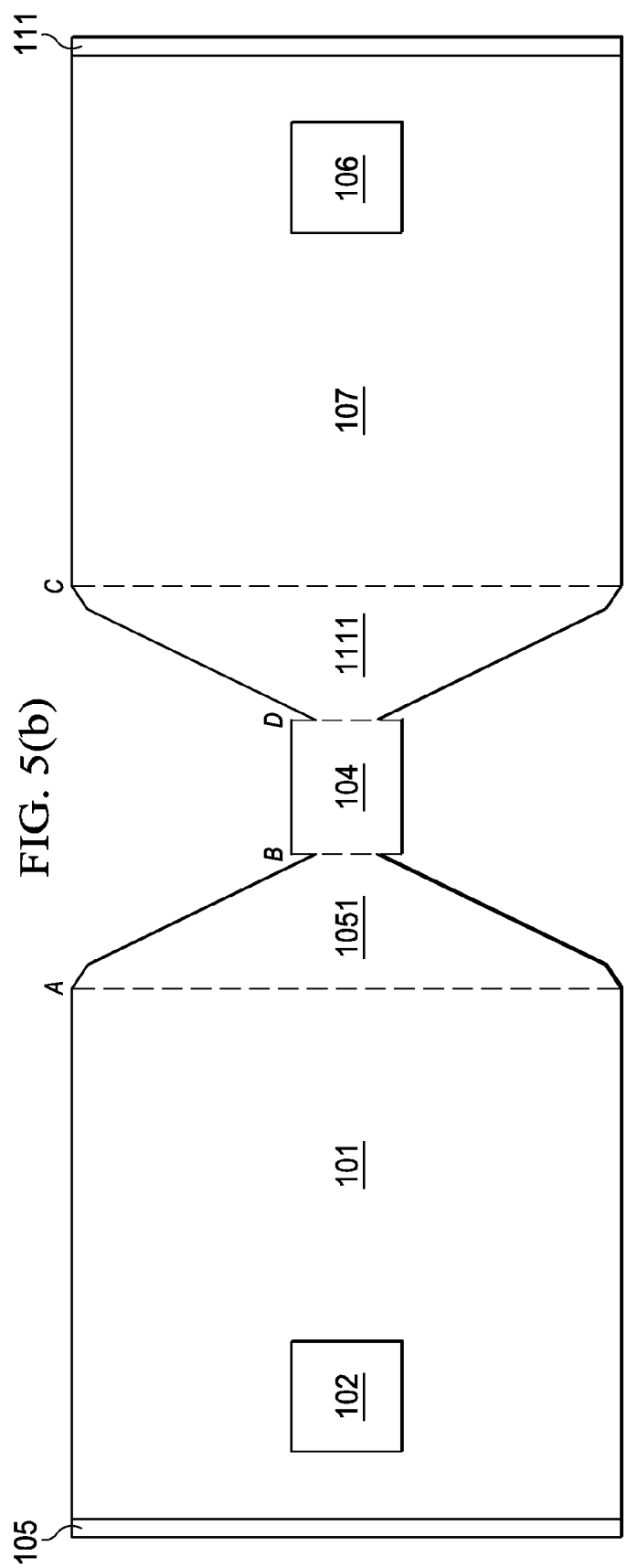

More details of the contact between sidewall of the via 104 and the bottom electrode 105 or the bottom electrode 111 are shown in FIG. 5(b) in top view. As illustrated in FIG. 5(b), the bottom electrode 105 may comprise two parts 1051 and 1053. The part 1053 may have a shape substantially similar to a shape of the top electrode 101, so that the two are overlapped in top view. The part 1053 may have a shape substantially similar to a shape of the insulator 103. The shape of the top electrode 101, which is substantially similar to a shape of the part 1053, may have a larger area than the bottom of the via 102, so that the via 102 may be placed on the surface of the top electrode 101. The part 1053 may be a polygon, a rectangle, a square, a trapezoid, or any other shape. A rectangle shape for the part 1053 is illustrated in FIG. 3(b).

The part 1051 of the bottom electrode 105 may be adjacent to the part 1053. The part 1051 may be a polygon, a trapezoid, or some other shape. An edge A of the part 1051 shared with the part 1053 may be longer than an edge B of the part 1051 shared with the sidewall of via 104. For example, if the part 1051 is a trapezoid, then the base edge A shared with the part 1053 is longer than the base edge B shared with the sidewall of via 104.

The bottom electrode 111 may comprise two parts 1111 and 1113. The part 1113 may have a shape substantially similar to a shape of the top electrode 107, so that the two are overlapped in top view. The shape of the top electrode 107, which is substantially similar to the shape of the part 1113, may have a larger area than the bottom of the via 106, so that the via 106 may be placed on the surface of the top electrode 107. The part 1113 may be a polygon, a rectangle, a square, a trapezoid, or any other shape. A rectangle shape for the part 1113 is illustrated in FIG. 5(b).

The part 1111 of the bottom electrode 111 may be adjacent to the part 1113. The part 1111 may be a polygon, a trapezoid, or some other shape. An edge C of the part 1111 shared with the part 1113 may be longer than an edge D of the part 1111 shared with another sidewall of via 104. For example, if the part 1111 is a trapezoid, then the base edge C shared with the part 1113 is longer than the base edge D shared with the sidewall of via 104.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps. In addition, each claim constitutes a separate embodiment, and the combination of various claims and embodiments are within the scope of the invention.

What is claimed is:

1. A metal insulator metal (MIM) capacitor, comprising:
a top electrode;
a first via contacting a surface of the top electrode;
a bottom electrode;
a second via contacting a surface of the bottom electrode; and
an insulator between the top electrode and the bottom electrode, wherein at least one of the top electrode and the bottom electrode comprises a first part where the respective via is contacting, a second part adjacent to the first part with a shared first edge, and a third part adjacent to the second part with a shared second edge, wherein the first edge is longer than the second edge.

2. The MIM capacitor of claim 1, further comprising:
a top electrode pick up connected to the first via; and
a bottom electrode pick up connected to the second via.

3. The MIM capacitor of claim 2, wherein:
the top electrode pick up is connected to a power source; and
the bottom electrode pick up is connected to a ground signal.

4. The MIM capacitor of claim 1, wherein the top electrode comprises a material selected from the group consisting essentially of titanium nitride (TiN), tantalum nitride (TaN), tungsten (W), tungsten nitride (WN), ruthenium (Ru), iridium (Ir), platinum (Pt), Copper (Cu), Cu alloy, or combinations of titanium (Ti) with titanium nitride.

5. The MIM capacitor of claim 1, wherein the insulator comprises a material selected from the group consisting essentially of silicon dioxide ($SiO_2$), silicon nitride ($Si_3N_4$), aluminum oxide ($Al_2O_3$), hafnium silicates (HfSiON), tantalum oxide ($Ta_2O_5$), zirconium oxide ($ZrO_2$), hafnium oxide ($HfO_2$), titanium oxide ($TiO_2$), barium strontium titanate oxide (BST), strontium titanate oxide (STO), or combinations thereof.

6. The MIM capacitor of claim 1, wherein the first part is a rectangle and the second part is a trapezoid, a base edge of the second part shared with the first part is longer than a base edge of the second part shared with the third part.

7. The MIM capacitor of claim 1, wherein the third part is a mirror image of a combined shape of the first part and the second part.

8. The MIM capacitor of claim 1, wherein the surface of the bottom electrode is a sidewall of the bottom electrode.

9. An metal insulator metal (MIM) capacitor comprising:
a first via placed on a surface of a top electrode;
a second via with a sidewall, the sidewall electrically connected to and in contact with a bottom electrode; and
an insulator between the top electrode and the bottom electrode, wherein the bottom electrode comprises a first part which underlies the insulator, a second part adjacent to the first part with a shared first edge, the second part being in contact with the sidewall of the second via with a shared second edge, wherein the first edge is longer than the second edge.

10. The MIM capacitor of claim 9, further comprising:
a top electrode pick up connected to the first via; and
a bottom electrode pick up connected to the second via.

11. The MIM capacitor of claim 10, wherein:
the top electrode pick up is connected to a power source; and
the bottom electrode pick up is connected to a ground signal.

12. The MIM capacitor of claim 9, wherein the top electrode comprises a material selected from the group consisting essentially of titanium nitride (TiN), tantalum nitride (TaN), tungsten (W), tungsten nitride (WN), ruthenium (Ru), iridium (Ir), platinum (Pt), Copper (Cu), Cu alloy, or combinations of titanium (Ti) with titanium nitride.

13. The MIM capacitor of claim 9, wherein the insulator comprises a material selected from the group consisting essentially of silicon dioxide ($SiO_2$), silicon nitride ($Si_3N_4$), aluminum oxide ($Al_2O_3$), hafnium silicates (HfSiON), tantalum oxide ($Ta_2O_5$), zirconium oxide ($ZrO_2$), hafnium oxide ($HfO_2$), titanium oxide ($TiO_2$), barium strontium titanate oxide (BST), strontium titanate oxide (STO), or combinations thereof.

14. A metal insulator metal (MIM) capacitor comprising:
a first via contacting and electrically connected to a bottom electrode;
a second via contacting and electrically connected to a top electrode, wherein in a top view, a shape of one of the top and the bottom electrodes comprises a first part that tapers off in a direction from a first edge of the first part to a second edge of the first part, the second edge being parallel to the first edge, wherein one of the first and the second edges contacts the respective via; and
an insulator between the top electrode and the bottom electrode.

15. The MIM capacitor of claim 14, further comprising:
a top electrode pick up connected to the second via; and
a bottom electrode pick up connected to the first via.

16. The MIM capacitor of claim 14, wherein the bottom electrode comprises a second part where the first via is contacting, the second part adjacent to the first part with a shared first edge, and a third part adjacent to the first part with a shared second edge, and the first edge is longer than the second edge.

17. The MIM capacitor of claim 14, wherein the top electrode comprises a second part which overlies the bottom electrode, the first part adjacent to the second part with a shared first edge, the first part contacting a sidewall of the second via with a shared second edge, wherein the first edge is longer than the second edge.

18. The MIM capacitor of claim 14, wherein the first edge contacts the respective via, wherein the shape of the one of the top and the bottom electrodes further comprises a second part adjacent to the first part, the second part and the first part sharing the second edge, wherein the second part tapers off in a direction from a third edge of the second part to the second edge, the third edge being parallel to the second edge.

19. The MIM capacitor of claim 14, wherein one of the first and the second vias contacts a sidewall of the respective electrode.

20. The MIM capacitor of claim 14, wherein the second edge is configured to burn out when a leakage current exceeds a pre-determined threshold.

* * * * *